(12) United States Patent
Puscasu et al.

(10) Patent No.: US 12,719,467 B2
(45) Date of Patent: Aug. 25, 2026

(54) CONTROLLING A POWER SWITCHING ELEMENT USING A SENSE SWITCHING ELEMENT

(71) Applicant: Infineon Technologies AG, Neubiberg (DE)

(72) Inventors: Razvan Puscasu, Dimbovita (RO); Vlad-George Moise, Buckarest (RO)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 18/622,369

(22) Filed: Mar. 29, 2024

(65) Prior Publication Data

US 2025/0309887 A1 Oct. 2, 2025

(51) Int. Cl.
*H03K 17/082* (2006.01)
*H03K 17/16* (2006.01)

(52) U.S. Cl.
CPC ....... *H03K 17/0822* (2013.01); *H03K 17/165* (2013.01)

(58) Field of Classification Search
CPC ......................... H03K 17/0822; H03K 17/165
See application file for complete search history.

(56) References Cited

U.S. PATENT DOCUMENTS

| | | | | |
|---|---|---|---|---|
| 9,923,500 | B1 * | 3/2018 | Ummelmann | H02P 7/06 |
| 2017/0237421 | A1 * | 8/2017 | Cui | H03K 17/04106 327/377 |
| 2019/0252969 | A1 * | 8/2019 | Li | H02M 3/158 |

* cited by examiner

*Primary Examiner* — Menatoallah Youssef
*Assistant Examiner* — Colleen J O Toole
(74) *Attorney, Agent, or Firm* — Shumaker & Sieffert, P.A.

(57) ABSTRACT

A circuit for controlling a power switching element includes a driving switching element configured to couple a voltage supply to a gate of the power switching element using a driving current and a sense switching element configured to generate an indication of a voltage drop at the driving switching element based on a reference current. The circuit further includes driving circuitry configured to generate the driving current, the driving current including both a control current proportional to the reference current and a compensation current based on the indication of the voltage drop at the driving switching element.

19 Claims, 12 Drawing Sheets

254
208
207
206
253
251
250
202
220
221
212
200

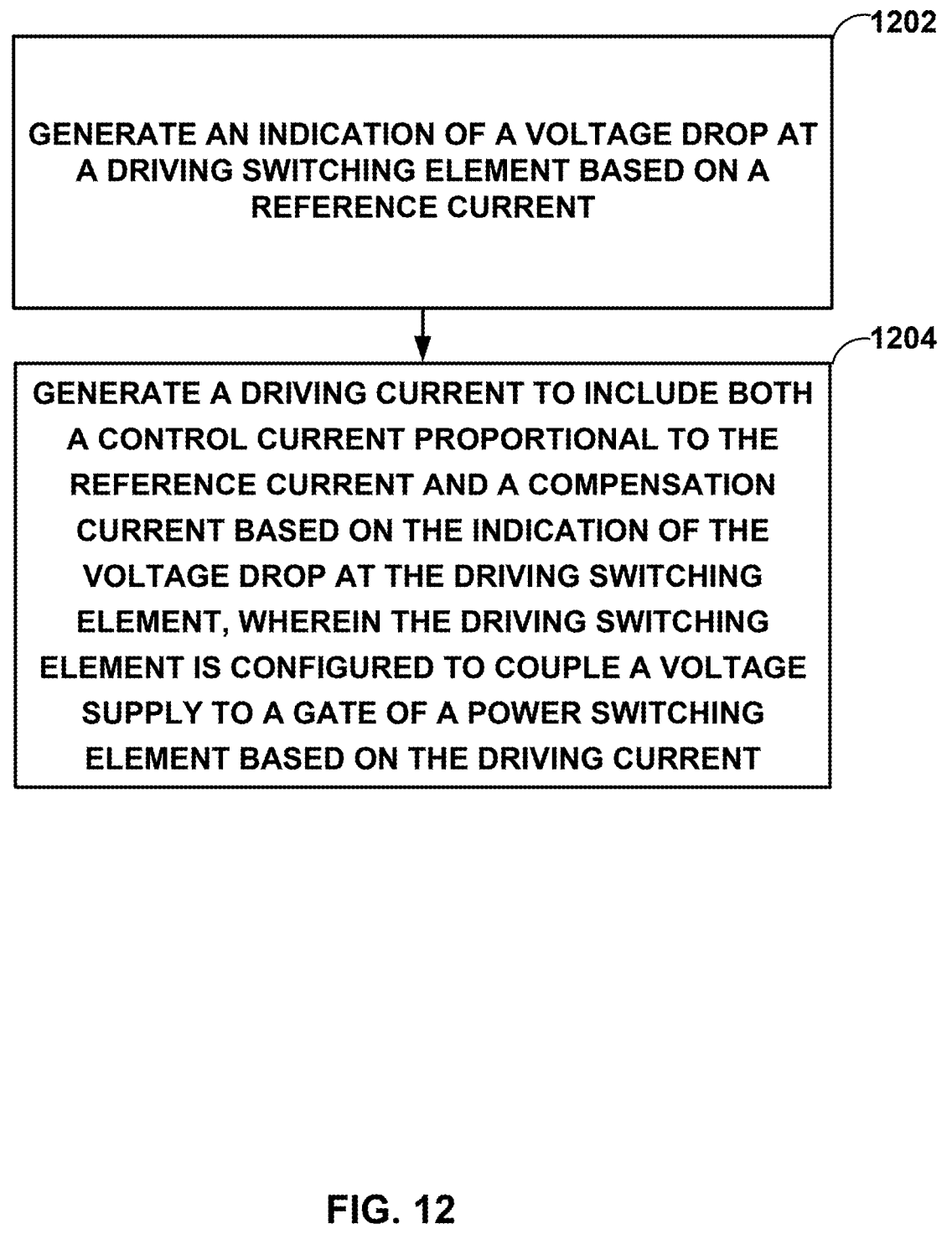

1202

GENERATE AN INDICATION OF A VOLTAGE DROP AT A DRIVING SWITCHING ELEMENT BASED ON A REFERENCE CURRENT

1204

GENERATE A DRIVING CURRENT TO INCLUDE BOTH A CONTROL CURRENT PROPORTIONAL TO THE REFERENCE CURRENT AND A COMPENSATION CURRENT BASED ON THE INDICATION OF THE VOLTAGE DROP AT THE DRIVING SWITCHING ELEMENT, WHEREIN THE DRIVING SWITCHING ELEMENT IS CONFIGURED TO COUPLE A VOLTAGE SUPPLY TO A GATE OF A POWER SWITCHING ELEMENT BASED ON THE DRIVING CURRENT

FIG. 12

CONTROLLING A POWER SWITCHING ELEMENT USING A SENSE SWITCHING ELEMENT

TECHNICAL FIELD

This disclosure relates to circuits and techniques for controlling a power switching element.

BACKGROUND

A gate driver circuit activates a switching element (e.g., a power transistor) based on a switching signal. For example, a gate driver circuit may drive a switching element to couple a phase of a motor to a high voltage rail (e.g., a battery voltage) during a first portion of a switching signal and to couple the phase of the motor to a low voltage rail (e.g., a reference or ground voltage) during a second portion of the switching signal.

SUMMARY

In general, this disclosure is directed to techniques for reducing a variation in a current used to drive a power switching element. During charge and discharge phases, an output current for controlling a gate of the power switching element may be affected by a voltage drop (e.g., a drain-to-source voltage drop) at the driving switching element. Techniques described herein compensate the output current provided by a control circuit to reduce or eliminate supply variations. For example, a sense switching element may be configured to generate an indication of a voltage drop at a driving switching element based on a reference current. In this example, driving circuitry may generate a driving current that includes both a control current proportional to the reference current and a compensation current based on the indication of the voltage drop at the driving switching element.

In one example, the disclosure describes a circuit for controlling a power switching element. The circuit includes a driving switching element configured to couple a voltage supply to a gate of the power switching element using a driving current and a sense switching element configured to generate an indication of a voltage drop at the driving switching element based on a reference current. The circuit further includes driving circuitry configured to generate the driving current, the driving current including both a control current proportional to the reference current and a compensation current based on the indication of the voltage drop at the driving switching element.

In another example, this disclosure describes a system including a power switching element and a driving switching element configured to couple a voltage supply to a gate of the power switching element based on a driving current. The system further includes a sense switching element configured to generate an indication of a voltage drop at the driving switching element based on a reference current and driving circuitry configured to generate the driving current, the driving current including both a control current proportional to the reference current and a compensation current based on the indication of the voltage drop at the driving switching element.

In one example, this disclosure describes a method including generating an indication of a voltage drop at a driving switching element based on a reference current and generating a driving current to include both a control current proportional to the reference current and a compensation current based on the indication of the voltage drop at the driving switching element. The driving switching element is configured to couple a voltage supply to a gate of a power switching element based on the driving current.

Details of these and other examples are set forth in the accompanying drawings and the description below. Other features, objects, and advantages will be apparent from the description and drawings, and from the claims.

BRIEF DESCRIPTION OF DRAWINGS

FIG. 12 is a flowchart illustrating an example process, in accordance with one or more techniques of the disclosure.

DETAILED DESCRIPTION

Figure 1:
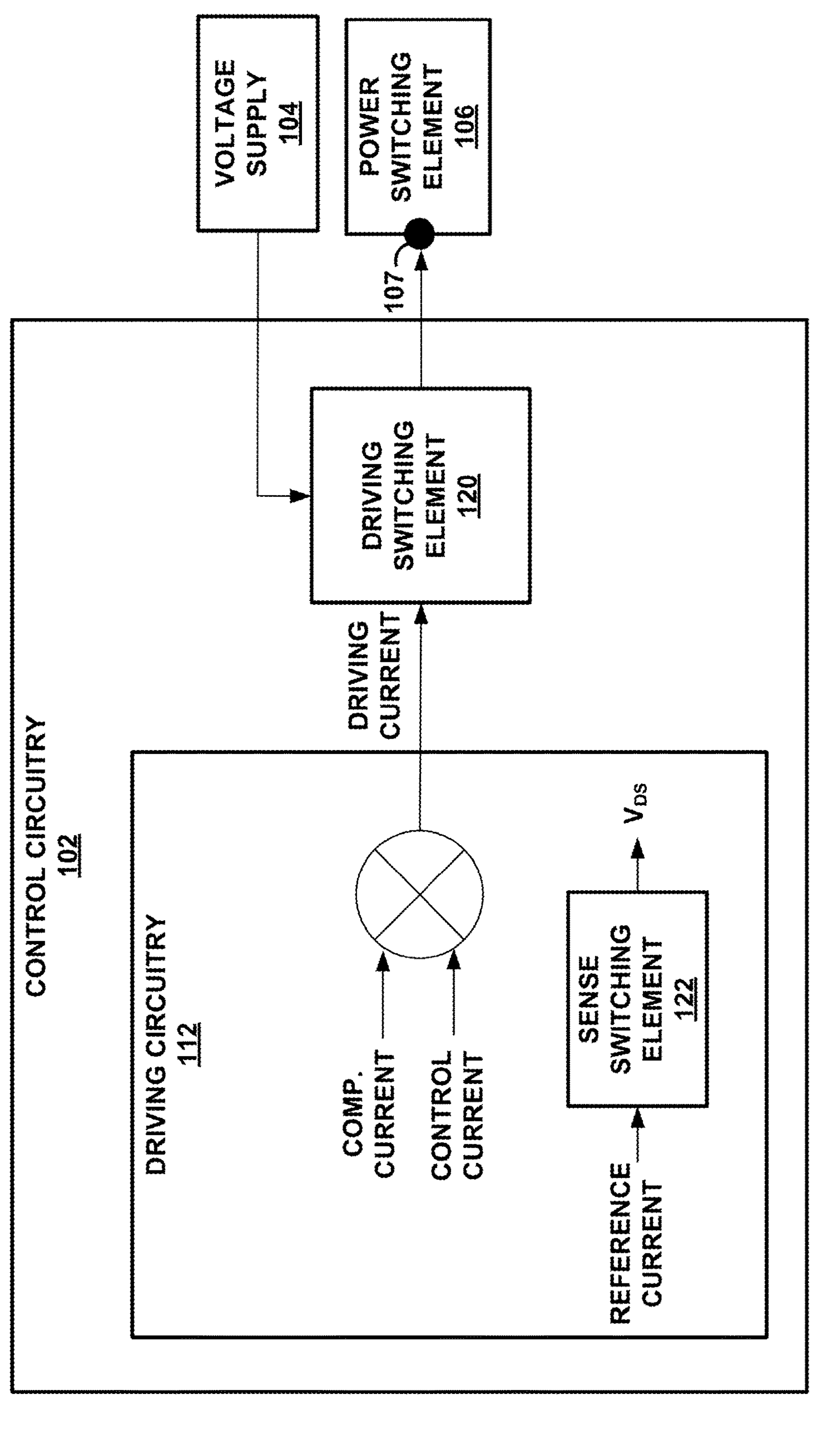
FIG. 1 is a block diagram illustrating an example system for controlling a power switching element using a sense switching element, in accordance with one or more techniques of this disclosure.

FIG. 1 is a block diagram illustrating an example system 100 for controlling a power switching element 106 using a sense switching element 122, in accordance with one or more techniques of this disclosure. As illustrated in the example of FIG. 1, system 100 may include control circuitry 102, voltage supply 104, and power switching element 106.

Voltage supply 104 may be configured to provide electrical power to one or more other components of system 100. For instance, voltage supply 104 may be configured to supply an input power to activate power switching element 106. In some examples, voltage supply 104 supply a voltage boosted from a voltage of a battery. For instance, voltage supply 104 may be a charge pump configured to supply a charge pump voltage ($V_{CP}$) that is greater than a battery voltage ($V_{BAT}$).

Power switching element 106 may be configured to generate a conductive channel based on a signal at a gate 107 of power switching element 106. For example, power switching element 106 may be configured to generate a conductive channel when a voltage at gate 107 of switching element 106 exceeds a threshold value.

Examples of switching elements may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. Switching elements may be high-side or low-side switching elements. For instance, power switching element 106 may include a high-side switching element. Additionally, switching elements may be voltage-controlled and/or current-controlled. Examples of current-controlled switching elements may include, but are not limited to, gallium nitride (GaN) MOSFETs, BJTs, or other current-controlled elements.

Control circuitry 102 may include driving circuitry 112 and driving switching element 120. Control circuitry 102 may include one or more processors, such as one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

Driving switching element 120 may be configured to couple voltage supply 104 to gate 107 of power switching element 106 using a driving current. As discussed in further detail below, driving circuitry 112 may provide the driving current to power switching element 106. For instance, driving circuitry 112 may provide the driving current to gate 107 of power switching element 106.

Driving circuitry 112 may include a sense switching element 122. Sense switching element 122 may be configured to generate an indication of a voltage drop at driving switching element 120 based on a reference current. driving circuitry 112 may use the indication of As described in further details below, the voltage drop to generate a compensation current (also referred to herein as simply "comp. current"). The compensation current may correct for a voltage drop at driving switching element 120. Driving circuitry 112 may be configured to use a reference current to generate the control current. For example, driving circuitry 112 may generate the driving current include the control current to be a ratio "K" greater than the reference current, where "K" is a positive integer greater than 1.

In accordance with the techniques of the disclosure, sense switching element 122 may generate an indication of a voltage drop ($V_{DS}$) at driving switching element 120 based on a reference current. In this example, driving circuitry 112 may generate a driving current to include both a control current proportional to the reference current and a compensation current based on the indication of the voltage drop at the driving switching element. Driving switching element 120 may be is configured to couple voltage supply 104 to gate 107 of power switching element 106 based on the driving current. In this way, driving circuitry 112 may provide driving current to driving switching element 120 that is more constant than systems that do not include the compensation current, which may help to reduce a power dissipation in system 100 and/or reduce a total amount of emissions of devices using system 100.

Figure 2:
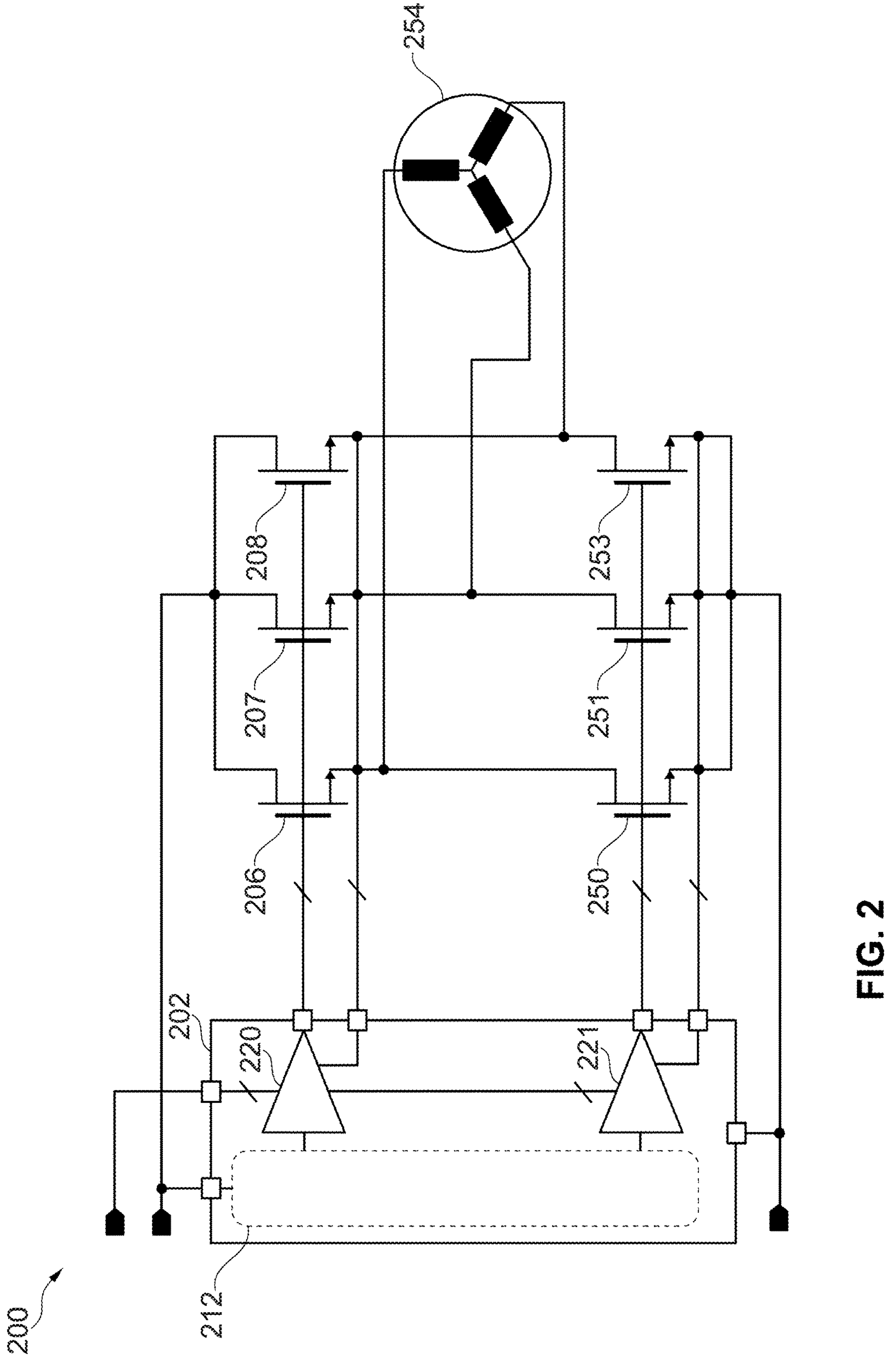
FIG. 2 is a block diagram illustrating an example system for controlling a power switching element in a motor control application, in accordance with one or more techniques of this disclosure.

FIG. 2 is a block diagram illustrating an example system 200 for controlling a power switching element 206 in a motor control application, in accordance with one or more techniques of this disclosure. FIG. 2 is discussed with FIG. 1 for example purposes only. The system of 200 includes control circuitry 202, high-side switching elements 206-208, low-side switching elements 250-252, and motor 254. Control circuitry 202 includes driving circuitry 212, driving switching element 220, and driving switching element 221.

For high voltage gate driver circuits (e.g., used in motor control applications), output currents (e.g., used for driving a half bridge circuit) may vary with the supply voltage during charge and/or discharge phases due to voltage drop on the output stages. In the example of FIG. 2, high-side switching elements 206-208 and low-side switching elements 250-252 may form a half-bridge in a motor control application. System 200 may receive a supply voltage (VBAT), such as, for example, a 12 V supply voltage. The supply voltage may be provided by, for example, a battery and/or other sources.

In the example of FIG. 2, high-side switching elements 206-208 may be turned on by increasing a gate voltage at with respect to a source voltage. For example, high-side switching element 206 may be turned on by increasing a voltage at a gate of high-side switching element 206 with respect to a voltage at a source of high-side switching element 206. Accordingly, some systems may use a floating gate driver to support the increase in voltage over supply voltage (e.g., VBAT). After a turn-on of high-side switching element 206, the source of high-side switching element 206 may be approximately equal to the supply voltage (e.g., SHx~VBAT). Low-side switching elements 250-252 may be turned on by increasing a gate voltage at with respect to a source voltage. For example, low-side switching element 250 may be turned on by increasing a voltage at a gate of low-side switching element 250 with respect to a voltage at a source of low-side switching element 250. A resistor can be placed between a source and ground (GND) of one or more of low-side switching elements 250-252 for current sensing. As used herein, ground may refer to a reference voltage and/or earth ground.

A gate of an active high-side switching element may be pulled up above the supply voltage in order to turn the active high-side switching element on completely. For example, switching element 206 may be pulled up about 10 V above the supply voltage (e.g., to about 22 V) in order to turn switching element 206 on completely. In the example of FIG. 2, the voltage at the gate of switching element 206 may be pulled up above the supply voltage (e.g., VBAT) by, for example, injecting a controlled current into the gate of switching element 206 using driving switching element 220, biased from a boosted supply rail (VCP) that supplies a higher voltage than the supply voltage (e.g., VCP>VBAT). When the charging phase starts, the voltage difference between the boosted supply and the gate of switching element 206 may be equal to the boosted voltage (e.g., VCP) and during the charge phase, the voltage difference between the boosted supply and the gate of switching element 206 may be falls down to a few volts. Driving switching element 220 may have a poor output impedance (e.g., the output stage may be built with high-voltage compliant devices with low output resistance). As such, the voltage variation between before starting the charging phase and during the charging phase may strongly affect the accuracy and/or performance of control circuitry 202. Moreover, failure to accurately control the slew rate of switching element 206 could also lead to emissions problems.

Figure 3:
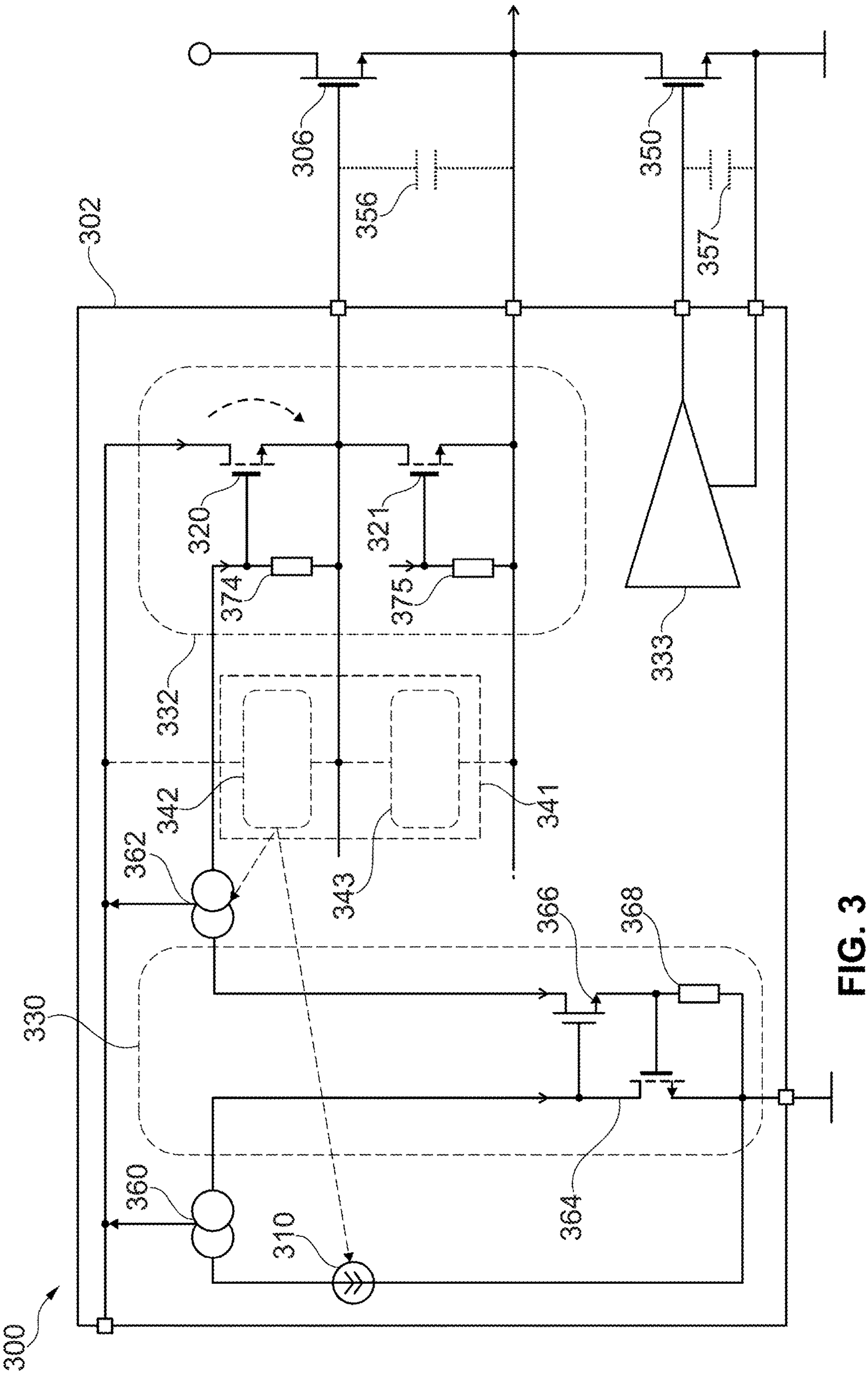
FIG. 3 is a conceptual diagram illustrating an example system for controlling a power switching element, in accordance with one or more techniques of this disclosure.

FIG. 3 is a conceptual diagram illustrating an example system 300 for controlling a power switching element 306, in accordance with one or more techniques of this disclosure. FIG. 3 is discussed with FIGS. 1-2 for example purposes only. System 300 includes control circuitry 302, high-side power switching element 306 (also referred to herein as simply "power switching element 306"), and low-side power switching element 350. System 300 may include intrinsic capacitance 356 (e.g., a gate-to-source capacitance of power switching element 306) and intrinsic capacitance 357 (e.g., a gate-to-source capacitance of low-side power switching element 350).

Control circuitry 302 may control an active power stage (e.g., a high-side and/or low-side power switching element). For example purposes only, FIG. 3 is discussed with the active power stage as the high-side power switching element, or more particularly, high-side power switching element 306 (HSx). However, in some examples, techniques described with respect to high-side power switching element 306 (HSx) may be applied to other high-side power switching elements and/or low-side power switching elements (e.g., low-side power switching element 350). Control circuitry 302 includes reference current generator 310, current mirror 360 (e.g., a 1:1 current mirror), pre-driving stage 330, current mirror 362, compensation circuitry 341, high-side driving stage 332 (also referred to herein as simply "driving stage 341"), and low-side driving stage 333. Pre-driving stage 330 includes a reference transistor 364, a charge current transistor 366, and a resistive element 368. Driving stage 332 includes resistive element 374, driving switching element 320, resistive element 375, driving switch element 321. Compensation circuitry 341 includes charging current compensation circuitry 342 (which is discuss in further details in FIGS. 4, 5) and driving current compensation circuitry 343 (which is discuss in further details in FIGS. 6, 7).

In order to fully turn on power switching element 306, control circuitry 302 may pull the gate potential (GHx) of power switching element 306 towards the boosted voltage (VCP) by, for example, injecting a controlled current through driving switching element 320 (e.g., Mchg). The process of turning on power switching element 306 (e.g., HSx) has a direct impact on several performance parameters such as, for example, power dissipation and/or electromagnetic emissions so therefore the current through Mchg may be accurately controlled by control circuitry 302.

Reference current generator 310 may feed a reference current (Iref) into reference transistor 364 (e.g., Mref transistor), inside pre-driving stage 330 (e.g., a VGS_REF block). Reference current generator 310, with reference transistor 364, may generate a corresponding VGS voltage, which is afterwards is converted into an Ivgs current through resistive element 368 (e.g., R resistor). Control circuitry 302, with current mirror 362, feeds the Ivgs current to resistive element 374 (e.g., a resistor placed on Mchg gate) in driving stage 332, such that VGS_Mref=VGS_Mchg. As these two devices (e.g., reference transistor 364 and switching element 320) have a 1:K ratio, the charging current is therefore proportional to Iref, where K is a positive integer. Thus, the gate control of power switching element 306 may be achieved with a driving current (e.g., driving stage 332) proportional to an internal reference current (VGS_REF). This Iref→IVgs→Iref conversion may be used to account for a high range of charge current values available, which may help to ensure that both reference transistor 364 and switching element 320 (e.g., Mref and Mchg) are operating in the same conditions.

At the start of a turn-on of power switching element 306 (e.g., the HSx turn-on phase), the drain-to-source voltage of driving switching element 320 (e.g., VDS of Mchg) is approximately equal to the boosted voltage (e.g., ~VCP), which may lead to a charging current error caused by a finite output resistance. The present disclosure proposes two processes for correcting the current error caused by a finite output resistance. Two proposed processes to compensate the driver's output current include: (1) sensing the VCP voltage and generating a correction term for the reference current (Iref compensation), which is indicated as charging current compensation circuitry 342 and (2) sensing the drain-to-source voltage (VDS) of the driver's output stage and generating a correction term for the charging device gate control current (Ivgs compensation), which is indicated as driving current compensation circuitry 343.

Some advantages of using the processes (e.g., charging current compensation circuitry 342 and/or driving current compensation circuitry 343) may include one or more of, for example, improved driving performance, lower emissions and the ability to use cheaper technological nodes with poor device performance. For example, during charge/discharge phases, the driver's output current (for controlling the active device's gate) is affected by the voltage drop on its output stage. Charging current compensation circuitry 342 and/or driving current compensation circuitry 343 may compensate the driver's output current, in order to make the driver's output current more insensitive to supply variations, which may help to improve slew rate control, potentially resulting in lower emissions and/or better performance. Compared to the case in which no compensation is employed, systems that use charging current compensation circuitry 342 and/or driving current compensation circuitry 343 may reduce the charge current error from ~20% to below 2% compared to systems that omit both charging current compensation circuitry 342 and driving current compensation circuitry 343.

Figure 4:
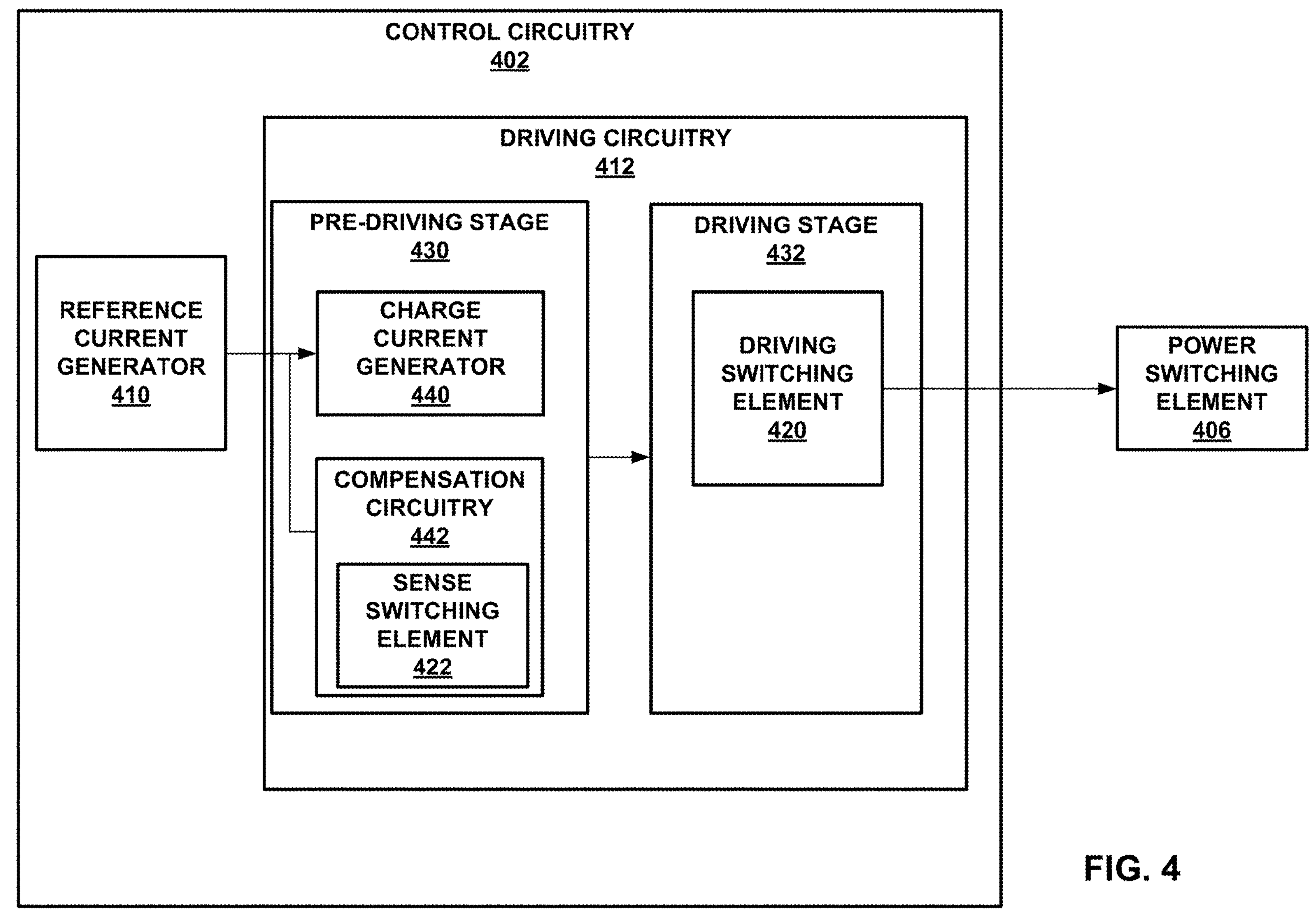
FIG. 4 is a block diagram illustrating first example details of the system for controlling a power switching element of FIG. 1, in accordance with one or more techniques of this disclosure.

FIG. 4 is a block diagram illustrating first example details of the system for controlling a power switching element of FIG. 1, in accordance with one or more techniques of this disclosure. FIG. 4 is discussed with FIGS. 1-3 for example purposes only. Control circuitry 402 is configured to drive power switching element 406. Control circuitry 402 includes reference current generator 410 and driving circuitry 412. Driving circuitry 412 includes pre-driving stage 430 and driving stage 432.

Driving circuitry 412, or more specifically, for example, pre-driving stage 430, includes compensation circuitry 442, which may be an example of charging current compensation circuitry 342 of FIG. 3. Compensation circuitry 442 may be configured to generate a correction current using an indication of the voltage drop generated by sense switching element 422. In this example, charge current generator 440 may be configured to generate a charge current using a corrected reference current that includes a combination of a reference current output by reference current generator 410 and the correction current output by compensation circuitry 442. Driving stage 432 may be configured to generate a driving current based on the charge current output by pre-driving stage 430. Generating the charge current using the corrected reference current may help to reduce a variation in a current driving power switching element 406 compared to systems that generate the charge current using only the reference current.

Figure 5:
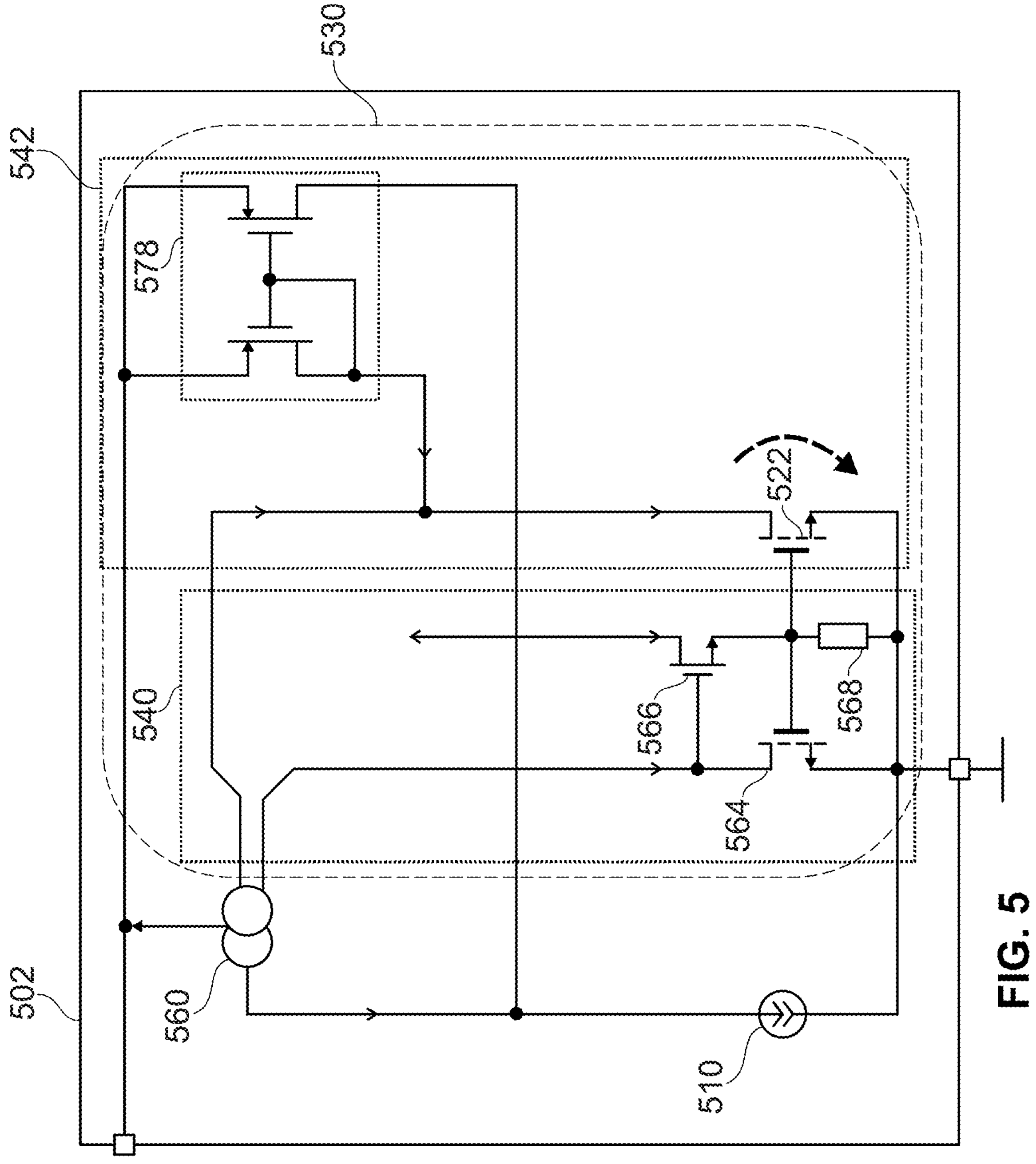
FIG. 5 is a circuit diagram illustrating example details of the system of FIG. 4, in accordance with one or more techniques of this disclosure.

FIG. 5 is a circuit diagram illustrating example details of the system of FIG. 4, in accordance with one or more techniques of this disclosure. FIG. 5 is discussed with FIGS. 1-4 for example purposes only. Control circuitry 502 includes reference current generator 510, current mirror 560, and pre-driving stage 530. While not shown, control circuitry 502 may include a driving stage, for example, driving stage 332 of FIG. 3. In some examples, control circuitry 502 may include driving stages for one or more high-side switching elements and/or low-side switching elements.

Pre-driving stage 530 includes charge current generator 540 and compensation circuitry 542. Charge current generator 540 includes a reference transistor 564, charge current transistor 566, and a resistive element 568. Reference transistor 564 may be configured to generate a reference voltage using the corrected reference current. For example, the corrected reference current may be represented by $(1-\alpha)$ *Iref, where $\alpha$ is a correction factor and Iref is the reference current generated by reference current generator 510. Charge current transistor 566 may be configured to generate, with resistive element 568, the charge current (e.g., Ivgs_chg) using the reference voltage.

In the example of FIG. 5, current mirror 560 (also referred to herein as "first current mirror 560") may be configured to output the corrected reference current. Reference transistor 564 comprises a gate, a drain configured to receive the corrected reference current from current mirror 560, and a source. In this example, sense switching element 522 comprises a gate coupled to the gate of reference transistor 564, a drain, and a source coupled to the source of reference transistor 564. Current mirror 578 (also referred to herein as "second current mirror 578") may be configured to supply the correction current to the drain of sense switching element 522 and to subtract the correction current from the reference current to generate the corrected reference current.

In the example of FIG. 5, sense switching element 522 (e.g., Msns) may be similar or identical to the reference transistor 564 (e.g., Mref) and biased with the same current and having approximately the same drain-to-source voltage (VDS) added to sense the boosted voltage (e.g., VCP voltage). For instance, switching element 522 and reference transistor 564 may be formed on a same die. Due to the drain current variation with drain-source voltage, the current through sense switching element 522 (e.g., Msns) is higher than the injected current (e.g., Iref). The difference may be fed to current mirror 578 (e.g., a M1-M2 mirror) and acts as a correction current, which may be subtracted directly from the injected reference current (e.g., Iref). In this example, reference transistor 564 (e.g., Mref) may be biased with an adjusted Iref value (e.g., $(1-\alpha)$*Iref), dependent on the boosted voltage (e.g., VCP). Consequently, the charge current (e.g., Ivgs_chg) driving a driving switching element (e.g., driving switching element 320 of FIG. 3) may include a compensation factor (e.g., $\alpha$), which may help to make the driving switching element drain current insensitive to variations in the boosted voltage (e.g., VCP).

Figure 6:
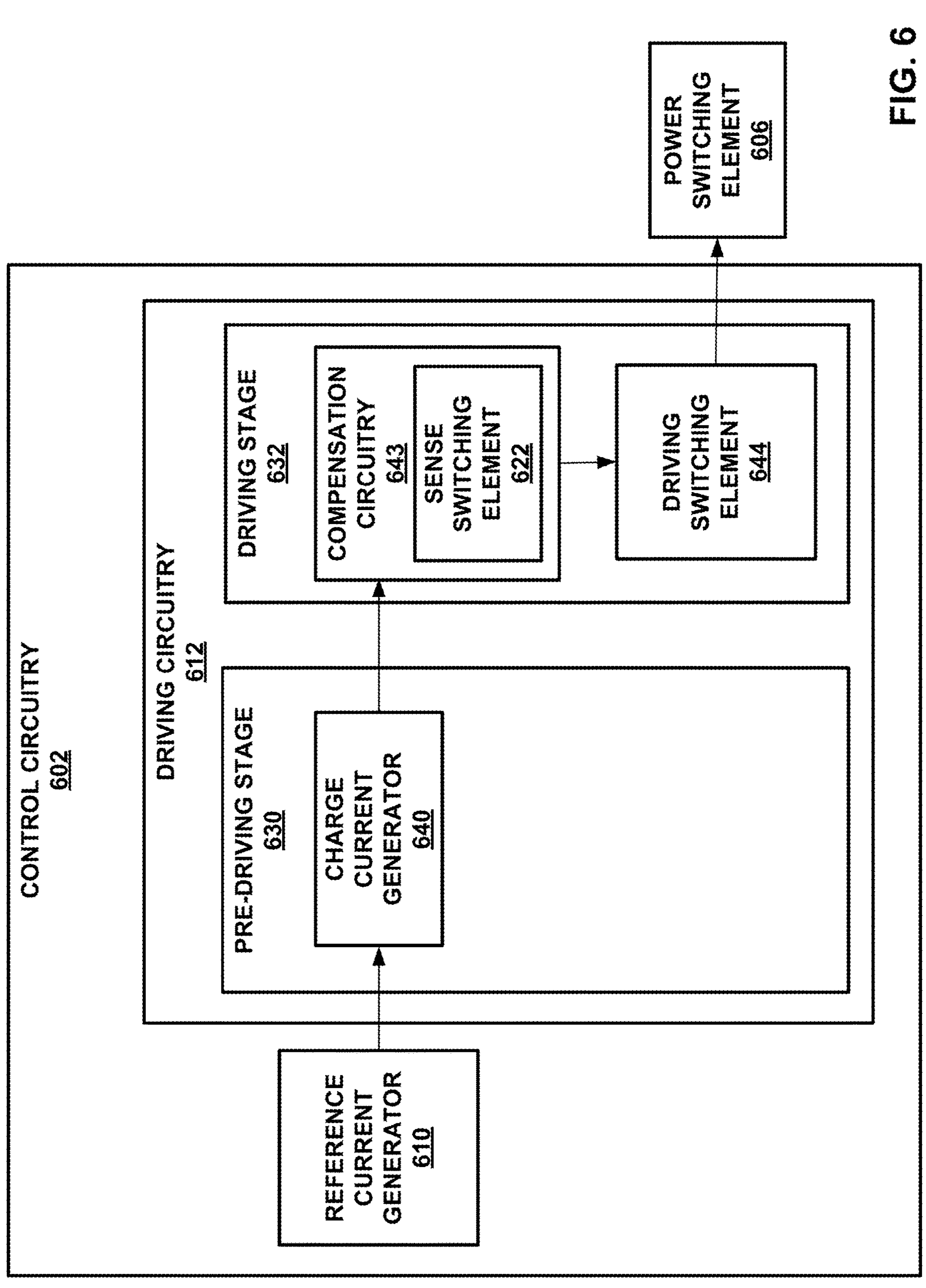
FIG. 6 is a block diagram illustrating second example details of the system for controlling a power switching element of FIG. 1, in accordance with one or more techniques of this disclosure.

FIG. 6 is a block diagram illustrating second example details of the system for controlling a power switching element of FIG. 1, in accordance with one or more techniques of this disclosure. FIG. 6 is discussed with FIGS. 1-5 for example purposes only. Control circuitry 602 is configured to drive power switching element 606. Control circuitry 602 includes reference current generator 610 and driving circuitry 612. Driving circuitry 612 includes pre-driving stage 630 and driving stage 632.

Driving circuitry 612, or more particularly, for example, pre-driving stage 630 includes a charge current generator 640 configured to generate a control current based on a reference current output by reference current generator 610. In this example, driving stage 632 includes compensation circuitry 643, which may be an example of driving current compensation circuitry 343 of FIG. 3. Compensation circuitry 643 may be configured to generate compensation current using an indication of the voltage drop generated by sense switching element 622. In this example, compensation circuitry 643 may be configured to generate a corrected charge current based on the control current and the compensation current. Driving stage 632 may be configured to generate the driving current based on the corrected charge current. For example, driving stage 632 may be configured to generate the driving current to be proportional to the corrected charge current (e.g., with a ratio of 1:K, where K is a positive integer). Generating the driving current based on the corrected charge current may help to reduce a variation in a current driving power switching element 606 compared to systems that generate the charge current using a charge current generated based on only on control current.

Figure 7:
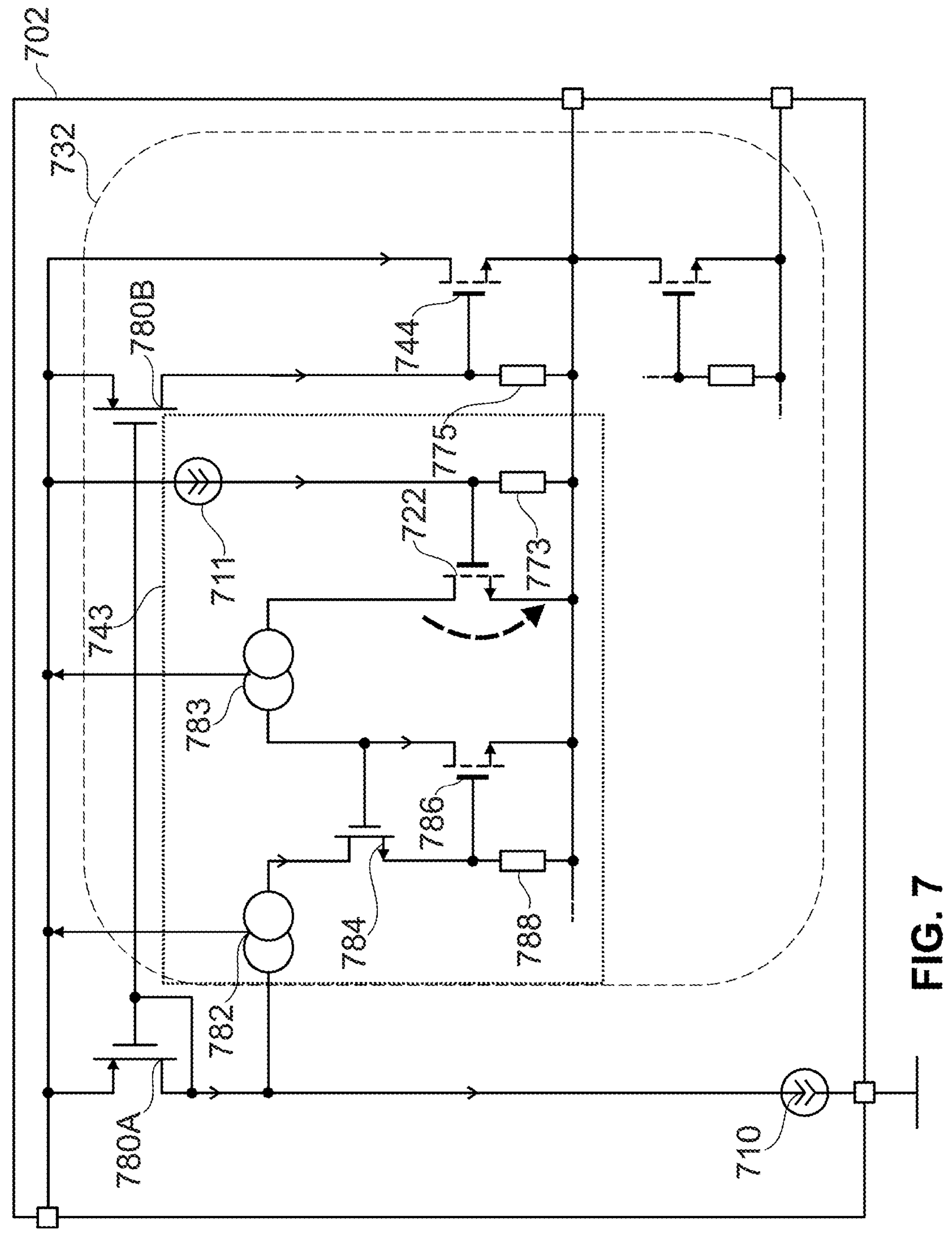
FIG. 7 is a circuit diagram illustrating example details of the system of FIG. 6, in accordance with one or more techniques of this disclosure.

FIG. 7 is a circuit diagram illustrating example details of the system of FIG. 6, in accordance with one or more techniques of this disclosure. FIG. 7 is discussed with FIGS. 1-6 for example purposes only. Control circuitry 702 is configured to drive a power switching element. Control circuitry 702 includes reference current generator 710, transistors 780A, 780B, which form current mirror 780, and driving stage 732. Driving stage 732 includes compensation circuitry 743, resistive element 775, and driving switching element 744. Driving switching element 744 may be configured to generate a driving current based on a corrected charge current output by compensation circuitry 743.

Compensation circuitry 743 may include a control current supply 783 (also referred to herein as first control current supply 783) configured to output a control current. In this example, sense transistor 722 (also referred to herein as first sense transistor 722) includes a gate coupled to control current supply 783, a drain, and a source. Compensation circuitry 743 may further include a first resistive element 773 is coupled in parallel with the gate of sense transistor 722 and the source of sense transistor 722. In this example, sense transistor 722 may be configured to generate an indication of the voltage drop as a current flowing from the drain of sense transistor 722 to the source of sense transistor 722 in response to a voltage resulting from the charge current flowing through first resistive element 773.

Compensation circuitry 743 may further include a second sense transistor 786, a first current mirror 783, a second resistive element 788, and a third sense transistor 784. Second sense transistor 786 may include a gate, a drain, and a source. First current mirror 783 may be configured to mirror an error current flowing from the drain of first sense transistor 722 to the source of first sense transistor 722 into the drain of second sense transistor 786. Second resistive element 788 may be coupled in parallel with the gate of second sense transistor 786 and the source of second sense transistor 786. Third sense transistor 784 may include a gate coupled to the drain of second sense transistor 786, a drain, and a source coupled to the gate of second sense transistor 786. Third sense transistor 784 may be configured to generate the compensation current at the drain of third sense transistor 784. First sense transistor 722 and second sense transistor 786 may be matched to each other (e.g., have a ratio of 1:1) and each be matched to driving switching element 744 (e.g., with a ratio of 1:K, where K is a positive integer).

Compensation circuitry 743 may further include a second control current supply 782 configured to output a current proportional to the control current. Current mirror 780 (also referred to herein as fourth current mirror 780) may be configured to mirror the current proportional to the control current (e.g., 2*Ivgs) minus the compensation current as the corrected charge current (e.g., Ivgs_chg). Driving stage 732 may be configured to generate the driving current to be proportional to the corrected charge current. For instance, driving stage 732 may be configured to generate the driving current to be a ratio of 1:K to the corrected charge current, where K is a positive integer.

The example circuit of FIG. 7 uses a principle of supply voltage monitoring but in the example of FIG. 6, the sensing is done directly in driving stage 732. Sense transistor 722 (e.g., Mchg_sns having a 1:K aspect ratio in respect to Mchg and approximately the same VDS) may be biased with Ivgs through second resistive element 788 (e.g., Rs resistor). At the beginning of the charging phase, the VDS of sense transistor 722 (e.g., Mchg_sns) may be approximately equal to the boosted voltage (e.g., ~VCP). The error current (Ichg_sns) may be mirrored and becomes reference current for another VGS_REF structure (Mcorr-RS). The output of this structure is a VGS_Mcorr/R current and includes the VDS current error of sense transistor 722, which is then subtracted from the main current 2*IVGS. Driving switching element 744 may be biased with an adjusted Ivgs_chg value, dependent on its VDS. Consequently, the output current of driving switching element 744 includes a compensation factor, which may help to make driving switching element 744 insensitive to VDS variations.

Figure 8:
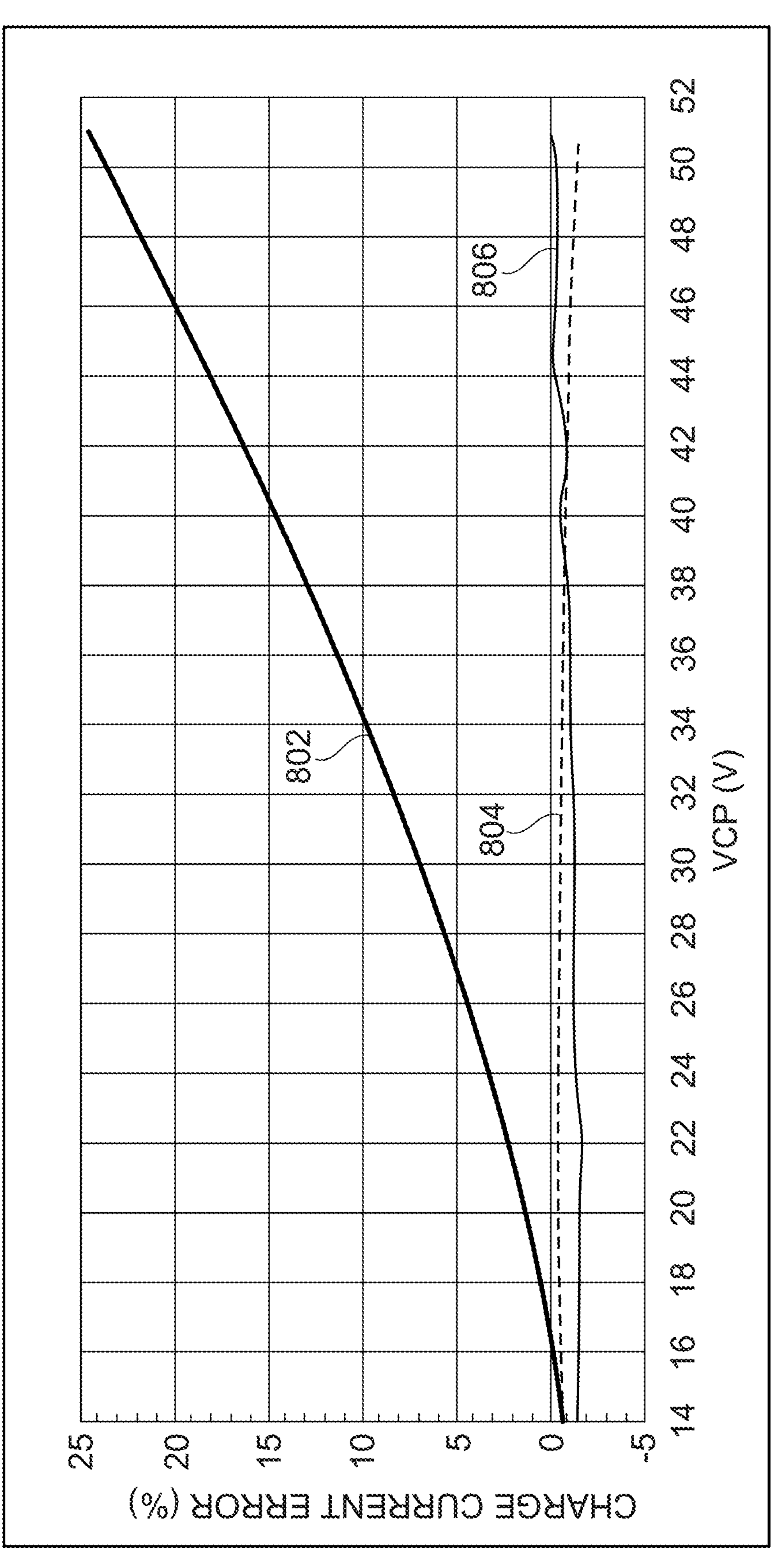
FIG. 8 is a graph chart illustrating a charge current error for various voltages at a 1 mA supply, in accordance with one or more techniques of the disclosure.

FIG. 8 is a graph chart illustrating a charge current error for various voltages at a 1 mA supply, in accordance with one or more techniques of the disclosure. FIG. 8 is discussed with FIGS. 1-7 for example purposes only. A comparison between charging current compensation circuitry 342 (also referred to herein as IVGS compensation), driving current compensation circuitry 343 (also referred to herein as IREF compensation), and no compensation is employed is presented in FIG. 8. The horizontal axis of FIG. 8 represents a boosted voltage (VCP) in volts (V) and the vertical axis of FIG. 8 represents a first charge current error 802 with no compensation, a second charge current error 804 with charging current compensation circuitry 342, and a third charge current error 806 with driving current compensation circuitry 343. The evaluation has been performed for two extreme values of the charge current in order to underline the performance. As show in in FIG. 8, for a charging current (Imchg) set to 1 mA, the error goes up to ~25% for high supply voltages without compensation while the proposed compensation techniques reduce the error to below 1.5%.

Figure 9:
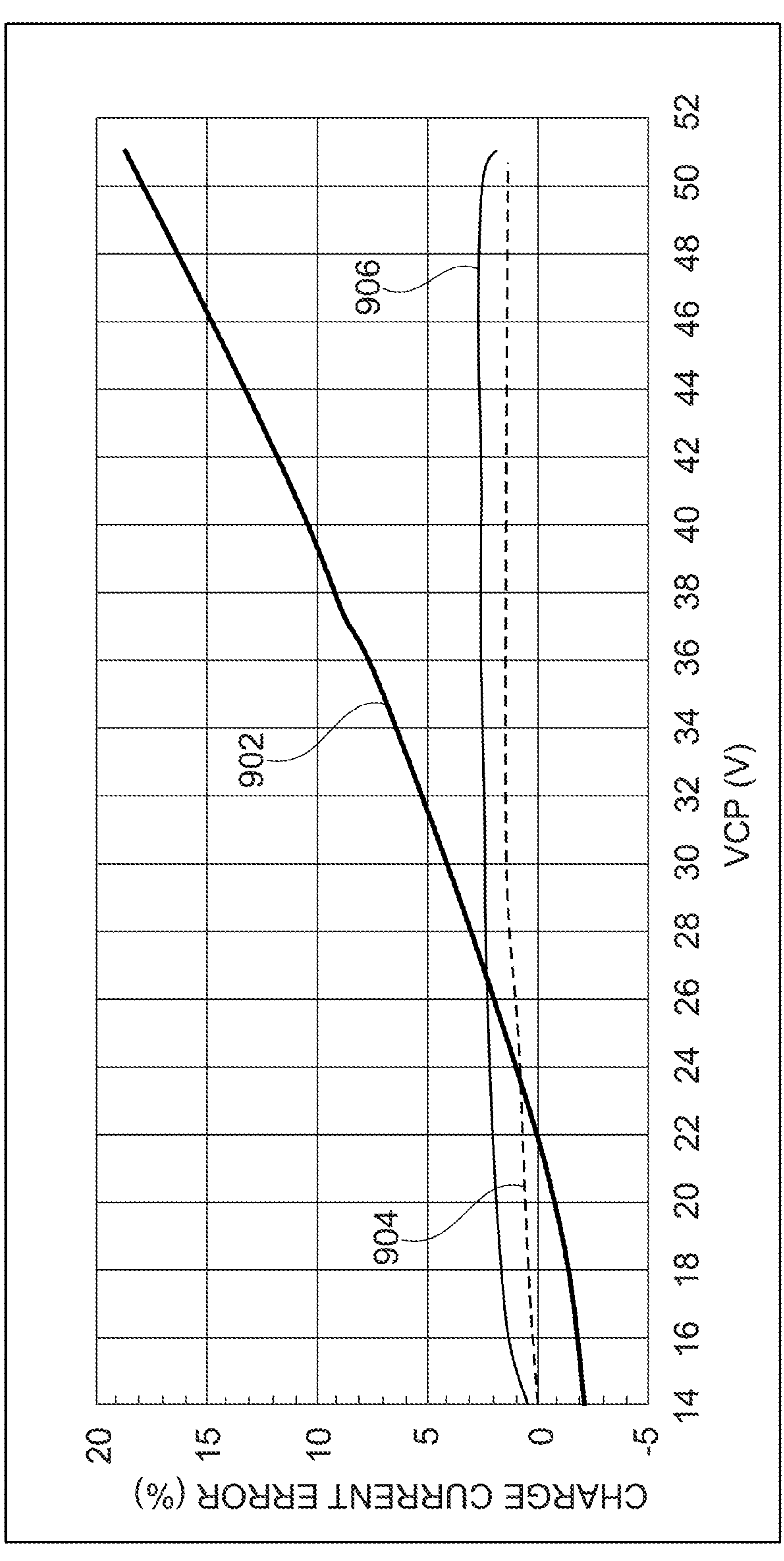
FIG. 9 is a graph chart illustrating a charge current error for various voltages at a 150 mA supply, in accordance with one or more techniques of the disclosure.

FIG. 9 is a graph chart illustrating a charge current error for various voltages at a 150 mA supply, in accordance with one or more techniques of the disclosure. FIG. 9 is discussed with FIGS. 1-8 for example purposes only. A comparison between charging current compensation circuitry 342 (also referred to herein as IVGS compensation), driving current compensation circuitry 343 (also referred to herein as IREF compensation), and no compensation is employed is presented in FIG. 8. The horizontal axis of FIG. 9 represents a boosted voltage (VCP) in volts (V) and the vertical axis of FIG. 9 represents a first charge current error 902 with no compensation, a second charge current error 904 with charging current compensation circuitry 342, and a third charge current error 906 with driving current compensation circuitry 343. The evaluation has been performed for two extreme values of the charge current in order to underline the performance. As show in in FIG. 9, the 150 mA charge current behavior yields similar results with the 1 mA behavior of FIG. 8, with the current error being kept below 2% using the proposed compensation techniques. Any remaining DC offsets can be easily removed with trimming.

Figure 10:
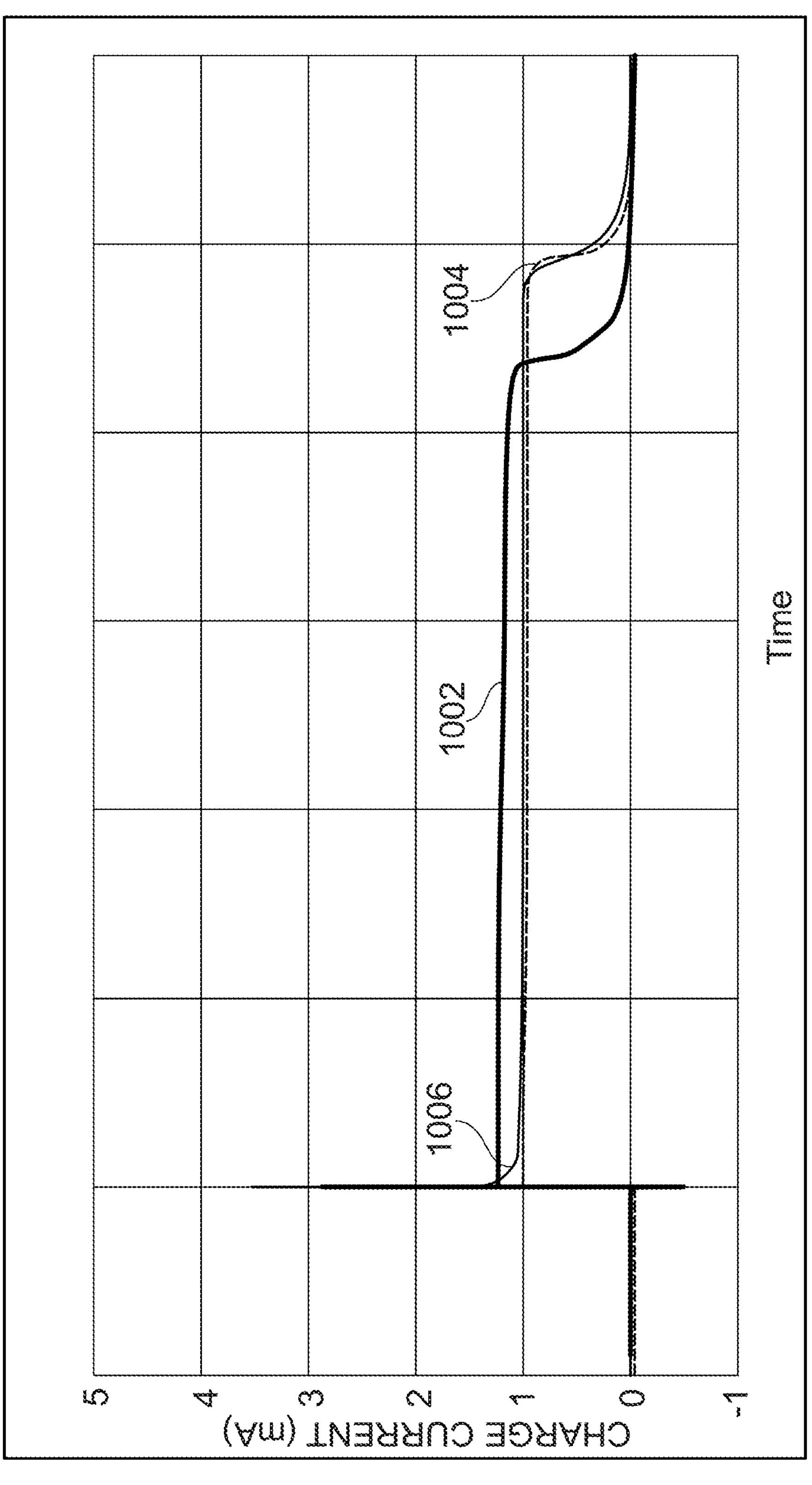
FIG. 10 is a graph chart illustrating a charge current over time at a 1 mA supply, in accordance with one or more techniques of the disclosure.

FIG. 10 is a graph chart illustrating a charge current over time at a 1 mA supply, in accordance with one or more techniques of the disclosure. FIG. 10 is discussed with FIGS. 1-9 for example purposes only. The horizontal axis of FIG. 10 represents time and the vertical axis of FIG. 10 represents a first charge current 1002 with no compensation, a second charge current 1004 with charging current compensation circuitry 342, and a third charge current 1006 with driving current compensation circuitry 343. As shown, the 1 mA charge current error is less than 2% using charging current compensation circuitry 342 or driving current compensation circuitry 343.

Figure 11:
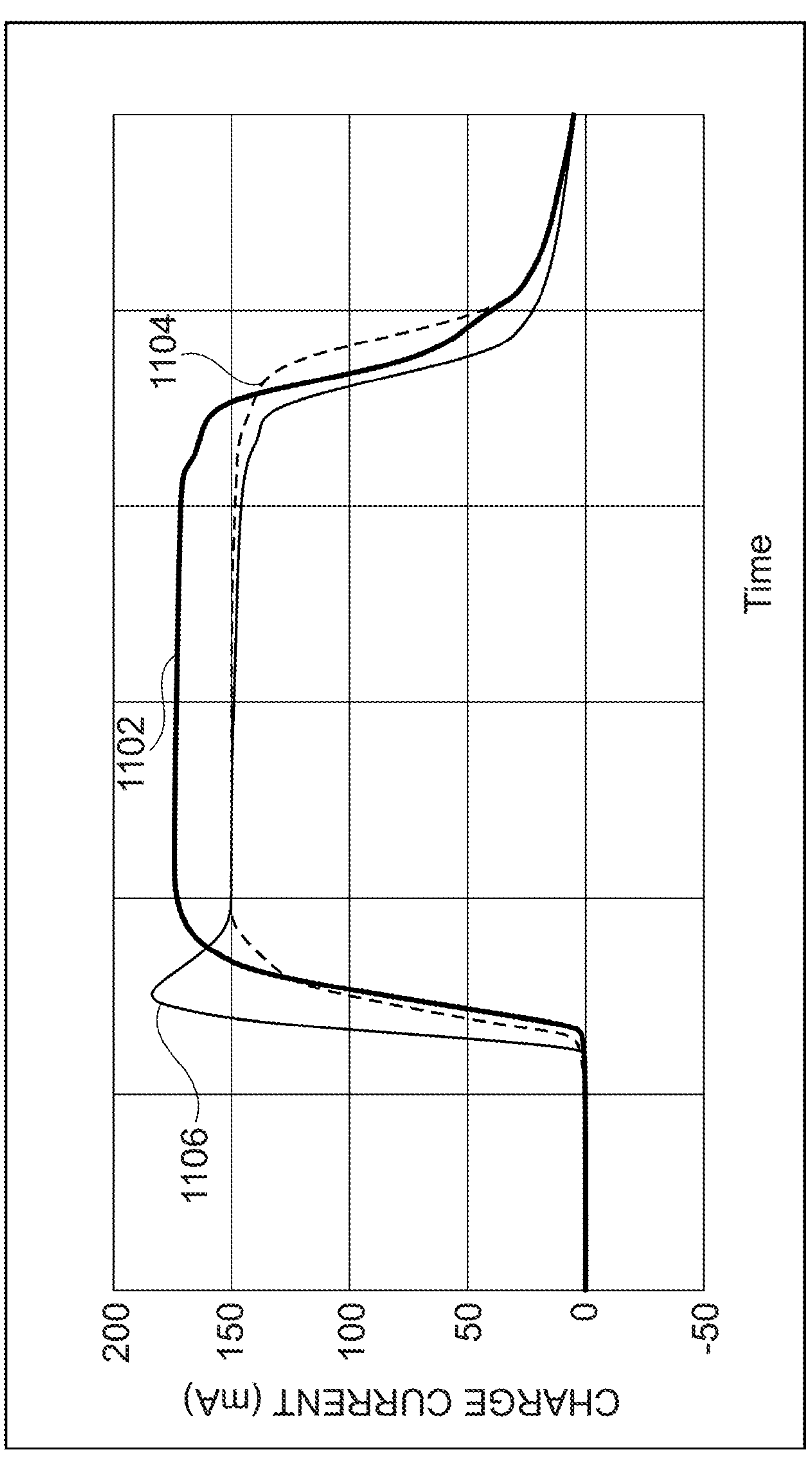
FIG. 11 is a graph chart illustrating a charge current over time at a 150 mA supply, in accordance with one or more techniques of the disclosure.

FIG. 11 is a graph chart illustrating a charge current over time at a 150 mA supply, in accordance with one or more techniques of the disclosure. FIG. 11 is discussed with FIGS. 1-10 for example purposes only. The horizontal axis of FIG. 11 represents time and the vertical axis of FIG. 11 represents a first charge current 1102 with no compensation, a second charge current 1104 with charging current compensation circuitry 342, and a third charge current 1106 with driving current compensation circuitry 343. As shown, the 150 mA charge current error is less than 2% using charging current compensation circuitry 342 or driving current compensation circuitry 343.

FIG. 12 is a flowchart illustrating an example process, in accordance with one or more techniques of the disclosure. FIG. 12 is discussed with FIGS. 1-11 for example purposes only. Control circuitry 102 may generate an indication of a voltage drop at a driving switching element based on a reference current (1202). Control circuitry 102 may generate a driving current to include both a control current proportional to the reference current and a compensation current based on the indication of the voltage drop at the driving switching element (1204). Driving switching element 120 may be configured to couple voltage supply 104 to a gate of power switching element 106 based on the driving current, where the driving switching element is configured to couple a voltage supply to a gate of a power switching element based on the driving current.

For example, compensation circuitry 442 of FIG. 4 may be configured to generate a correction current using the indication of the voltage drop generated by sense switching element 422. In this example, charge current generator 440 may be configured to generate a charge current using a corrected reference current. The corrected reference current may include a combination of the reference current and the correction current. Driving stage 432 may be configured to generate the driving current based on the charge current In some examples, charge current generator 640 of FIG. 6 may be configured to generate the control current based on the reference current. In this example, compensation circuitry 643 may be configured to generate the compensation current using the indication of the voltage drop generated by the sense switching element and generate a corrected charge current based on the control current and the compensation current. Driving stage 632 may be configured to generate the driving current based on the corrected charge current.

The following clauses may illustrate one or more aspects of the disclosure.

Clause 1: A circuit for controlling a power switching element, the circuit comprising: a driving switching element configured to couple a voltage supply to a gate of the power switching element using a driving current; a sense switching element configured to generate an indication of a voltage drop at the driving switching element based on a reference current; and driving circuitry configured to generate the driving current, the driving current including both a control current proportional to the reference current and a compensation current based on the indication of the voltage drop at the driving switching element.

Clause 2: The circuit of clause 1, wherein the driving circuitry comprises: compensation circuitry configured to generate a correction current using the indication of the voltage drop generated by the sense switching element; a charge current generator configured to generate a charge current using a corrected reference current, the corrected reference current comprising a combination of the reference current and the correction current; and a driving stage configured to generate the driving current based on the charge current.

Clause 3: The circuit of clause 2, wherein the driving stage is configured to generate the driving current to be proportional to the charge current output by the charge current generator.

Clause 4: The circuit of clauses 2-3, wherein the charge current generator comprises: a reference transistor configured to generate a reference voltage using the corrected reference current; and a charge current transistor configured to generate, with a resistive element, the charge current using the reference voltage.

Clause 5: The circuit of clause 4, further comprising: a first current mirror configured to output the corrected reference current; wherein the reference transistor comprises a gate, a drain configured to receive the corrected reference current from the first current mirror, and a source; wherein the sense switching element comprises a gate coupled to the gate of the reference transistor, a drain, and a source coupled to the source of the reference transistor; and a second current mirror configured to supply the correction current to the drain of the sense transistor and to subtract the correction current from the reference current to generate the corrected reference current.

Clause 6: The circuit of clause 1, wherein the driving circuitry comprises: a charge current generator configured to generate the control current based on the reference current; compensation circuitry configured to: generate the compensation current using the indication of the voltage drop generated by the sense switching element; and generate a corrected charge current based on the control current and the compensation current; and a driving stage configured to generate the driving current based on the corrected charge current.

Clause 7: The circuit of clause 6, wherein the driving stage is configured to generate the driving current to be proportional to the corrected charge current.

Clause 8: The circuit of clauses 6-7, wherein the compensation circuit comprises: a control current supply configured to output the control current; the sense transistor, wherein the sense transistor comprises a gate coupled to the control current supply, a drain, and a source; a first resistive element is coupled in parallel with the gate of the sense transistor and the source of the sense transistor; and wherein to generate the indication of the voltage drop, the sense transistor is configured to generate the indication of the voltage drop as a current flowing from the drain of the sense transistor to the source of the sense transistor in response to a voltage resulting from the charge current flowing through the first resistive element.

Clause 9: The circuit of clause 8, wherein the sense transistor comprises a first sense transistor and wherein the compensation circuitry further comprises: a second sense transistor comprising a gate, a drain, and a source; a first current mirror configured to mirror an error current flowing from the drain of the first sense transistor to the source of the first sense transistor into the drain of the second sense transistor; a second resistive element is coupled in parallel with the gate of the second sense transistor and the source of the second sense transistor; a third sense transistor comprising a gate coupled to the drain of the second sense transistor, a drain, and a source coupled to the gate of the second sense transistor; and wherein the third sense transistor is configured to generate the compensation current at the drain of the third sense transistor.

Clause 10: The circuit of clause 9, wherein the compensation circuitry further comprises a second control current supply configured to output a current proportional to the control current; and wherein the circuit further comprises a fourth current mirror configured to mirror the current proportional to the control current minus the compensation current as the corrected charge current.

Clause 11: The circuit of clause 10, wherein the driving stage is configured to generate the driving current to be proportional to the corrected charge current.

Clause 12: The circuit of clauses 1-11, wherein the power switching element comprises a high-side switching element.

Clause 13: The circuit of clauses 1-12, wherein the power switching element is configured to electrically couple a motor phase of a motor to the voltage supply when activated by the driving current.

Clause 14: The circuit of clauses 1-13, wherein the circuit comprises a floating gate driver.

Clause 15: The circuit of clauses 1-14, wherein the voltage drop at the driving switching element comprises a drain-to-source voltage drop of the driving switching element.

Clause 16: The circuit of clauses 1-15, wherein the sense switching element and the driving switching element comprises a 1 to K aspect ratio, wherein K is a positive integer greater than 1.

Clause 17: A system comprising: a power switching element; a driving switching element configured to couple a voltage supply to a gate of the power switching element based on a driving current; a sense switching element configured to generate an indication of a voltage drop at the driving switching element based on a reference current; and driving circuitry configured to generate the driving current, the driving current including both a control current proportional to the reference current and a compensation current based on the indication of the voltage drop at the driving switching element.

Clause 18: The system of clause 17, further comprising a motor coupled to a source of the power switching element.

Clause 19: The system of clauses 17-18, wherein the driving circuitry comprises: compensation circuitry configured to generate a correction current using the indication of the voltage drop generated by the sense switching element; a charge current generator configured to generate a charge current using a corrected reference current, the corrected reference current comprising a combination of the reference current and the correction current; and a driving stage configured to generate the driving current based on the charge current.

Clause 20: A method comprising: generating an indication of a voltage drop at a driving switching element based on a reference current; and generating a driving current to include both a control current proportional to the reference current and a compensation current based on the indication of the voltage drop at the driving switching element, wherein the driving switching element is configured to couple a voltage supply to a gate of a power switching element based on the driving current.

Various aspects have been described in the disclosure. These and other aspects are within the scope of the following claims.

What is claimed is:

1. A circuit for controlling a power switching element, the circuit comprising:

a driving switching element configured to couple a voltage supply to a gate of the power switching element using a driving current;

a sense switching element configured to generate an indication of a voltage drop at the driving switching element based on a reference current; and driving circuitry configured to generate the driving current, the driving current including both a control current proportional to the reference current and a compensation current based on the indication of the voltage drop at the driving switching element, wherein the driving circuitry comprises:

compensation circuitry configured to generate a correction current using the indication of the voltage drop generated by the sense switching element;

a charge current generator configured to generate a charge current using a corrected reference current, the corrected reference current comprising a combination of the reference current and the correction current; and a driving stage configured to generate the driving current based on the charge current.

2. The circuit of claim 1, wherein the driving stage is configured to generate the driving current to be proportional to the charge current output by the charge current generator.

3. The circuit of claim 1, wherein the charge current generator comprises:

a reference transistor configured to generate a reference voltage using the corrected reference current; and a charge current transistor configured to generate, with a resistive element, the charge current using the reference voltage.

4. The circuit of claim 3, further comprising:

a first current mirror configured to output the corrected reference current;

wherein the reference transistor comprises a gate, a drain configured to receive the corrected reference current from the first current mirror, and a source;

wherein the sense switching element comprises a gate coupled to the gate of the reference transistor, a drain, and a source coupled to the source of the reference transistor; and a second current mirror configured to supply the correction current to the drain of the sense switching element and to subtract the correction current from the reference current to generate the corrected reference current.

5. A circuit for controlling a power switching element, the circuit comprising:

a driving switching element configured to couple a voltage supply to a gate of the power switching element using a driving current;

a sense switching element configured to generate an indication of a voltage drop at the driving switching element based on a reference current; and driving circuitry configured to generate the driving current, the driving current including both a control current proportional to the reference current and a compensation current based on the indication of the voltage drop at the driving switching element, wherein the driving circuitry comprises:

a charge current generator configured to generate the control current based on the reference current;

compensation circuitry configured to:

generate the compensation current using the indication of the voltage drop generated by the sense switching element; and generate a corrected charge current based on the control current and the compensation current; and a driving stage configured to generate the driving current based on the corrected charge current.

6. The circuit of claim 5, wherein the driving stage is configured to generate the driving current to be proportional to the corrected charge current.

7. The circuit of claim 5, wherein the compensation circuitry comprises:

a control current supply configured to output the control current;

the sense switching element, wherein the sense switching element comprises a gate coupled to the control current supply, a drain, and a source;

a first resistive element is coupled in parallel with the gate of the sense switching element and the source of the sense switching element; and wherein to generate the indication of the voltage drop, the sense switching element is configured to generate the indication of the voltage drop as a current flowing from the drain of the sense switching element to the source of the sense switching element in response to a voltage resulting from the charge current flowing through the first resistive element.

8. The circuit of claim 7, wherein the sense switching element comprises a first sense transistor and wherein the compensation circuitry further comprises:

a second sense transistor comprising a gate, a drain, and a source;

a first current mirror configured to mirror an error current flowing from the drain of the first sense transistor to the source of the first sense transistor into the drain of the second sense transistor;

a second resistive element is coupled in parallel with the gate of the second sense transistor and the source of the second sense transistor;

a third sense transistor comprising a gate coupled to the drain of the second sense transistor, a drain, and a source coupled to the gate of the second sense transistor; and wherein the third sense transistor is configured to generate the compensation current at the drain of the third sense transistor.

9. The circuit of claim 8, wherein the compensation circuitry further comprises a second control current supply configured to output a current proportional to the control current; and wherein the circuit further comprises a fourth current mirror configured to mirror the current proportional to the control current minus the compensation current as the corrected charge current.

10. The circuit of claim 9, wherein the driving stage is configured to generate the driving current to be proportional to the corrected charge current.

11. The circuit of claim 1, wherein the power switching element comprises a high-side switching element.

12. The circuit of claim 1, wherein the power switching element is configured to electrically couple a motor phase of a motor to the voltage supply when activated by the driving current.

13. The circuit of claim 1, wherein the circuit further comprises a floating gate driver.

14. The circuit of claim 1, wherein the voltage drop at the driving switching element comprises a drain-to-source voltage drop of the driving switching element.

15. The circuit of claim 1, wherein the sense switching element and the driving switching element comprises a 1 to K aspect ratio, wherein K is a positive integer greater than 1.

16. A system comprising:

a power switching element;

a driving switching element configured to couple a voltage supply to a gate of the power switching element based on a driving current;

a sense switching element configured to generate an indication of a voltage drop at the driving switching element based on a reference current; and driving circuitry configured to generate the driving current, the driving current including both a control current proportional to the reference current and a compensation current based on the indication of the voltage drop at the driving switching element, wherein the driving circuitry comprises:

compensation circuitry configured to generate a correction current using the indication of the voltage drop generated by the sense switching element;

a charge current generator configured to generate a charge current using a corrected reference current, the corrected reference current comprising a combination of the reference current and the correction current; and a driving stage configured to generate the driving current based on the charge current.

17. The system of claim 16, further comprising a motor coupled to a source of the power switching element.

18. A method comprising:

generating an indication of a voltage drop at a driving switching element based on a reference current;

generating a driving current to include both a control current proportional to the reference current and a compensation current based on the indication of the voltage drop at the driving switching element, wherein the driving switching element is configured to couple a voltage supply to a gate of a power switching element based on the driving current, wherein generating the driving current comprises:

generating a correction current using the indication of the voltage drop;

generating a charge current using a corrected reference current, the corrected reference current comprising a combination of the reference current and the correction current; and generating the driving current based on the charge current.

19. A method comprising:

generating an indication of a voltage drop at a driving switching element based on a reference current;

generating a driving current to include both a control current proportional to the reference current and a compensation current based on the indication of the voltage drop at the driving switching element, wherein the driving switching element is configured to couple a voltage supply to a gate of a power switching element based on the driving current, wherein generating the driving current comprises:

generating the control current based on the reference current;

generating the compensation current using the indication of the voltage drop;

generating a corrected charge current based on the control current and the compensation current; and generating the driving current based on the corrected charge current.

* * * * *